United States Patent
Gawer et al.

(10) Patent No.: US 10,590,528 B2
(45) Date of Patent: Mar. 17, 2020

(54) DEVICE FOR COATING EXTRA-LONG SHEET-TYPE SUBSTRATES, IN PARTICULAR GLASS PANES, IN A VACUUM COATING SYSTEM

(71) Applicant: GRENZEBACH MASCHINENBAU GMBH, Asbach-Baeumenheim (DE)

(72) Inventors: Olaf Gawer, Dresden (DE); Holger Richert, Bruchkoebel (DE); Jens Ellrich, Huisheim (DE)

(73) Assignee: GRENZEBACH MASCHINENBAU GMBH, Asbach-Baeumenheim (DE)

( * ) Notice: Subject to any disclaimer, the term of this patent is extended or adjusted under 35 U.S.C. 154(b) by 0 days.

(21) Appl. No.: 15/767,477

(22) PCT Filed: Oct. 20, 2016

(86) PCT No.: PCT/DE2016/000376
§ 371 (c)(1),
(2) Date: Apr. 11, 2018

(87) PCT Pub. No.: WO2017/071677
PCT Pub. Date: May 4, 2017

(65) Prior Publication Data
US 2018/0305808 A1    Oct. 25, 2018

(30) Foreign Application Priority Data
Oct. 26, 2015 (DE) .......... 10 2015 013 799

(51) Int. Cl.
*C23C 14/54* (2006.01)
*C23C 14/56* (2006.01)

(52) U.S. Cl.
CPC ............ *C23C 14/562* (2013.01); *C23C 14/54* (2013.01); *C23C 14/566* (2013.01); *C23C 14/568* (2013.01)

(58) Field of Classification Search
CPC ..... C23C 14/562; C23C 14/54; C23C 14/566; C23C 14/568
See application file for complete search history.

(56) References Cited

U.S. PATENT DOCUMENTS 4,042,128 A * 8/1977 Shrader ................ C23C 14/568
414/287
5,167,756 A * 12/1992 Lenhardt ................ C03C 27/10
156/107

(Continued)

FOREIGN PATENT DOCUMENTS

| CN | 203683659 | 7/2014 |
| CN | 204848657 | 12/2015 |

(Continued)

OTHER PUBLICATIONS

Makki, Emad A., et al., "Response of Coated Laminated Glass Panels Subjected to Combined Blast and Temperature Loadings". J. Dynamic Behavior Mater (2015) 1:409-422.*

*Primary Examiner* — Bret P Chen
(74) *Attorney, Agent, or Firm* — Duane Morris LLP; J. Rodman Steele, Jr.; Gregory M. Lefkowitz

(57) ABSTRACT

A device for coating sheet-type substrates, in particular glass panes, in a vacuum coating system is described. The system includes a) a series connection of chambers, through which each substrate sheet passes and which are arranged on the entry side, namely a load lock chamber, a buffer chamber and a transfer chamber, each of which is vacuum-sealable by a check valve. An area of process chambers follows the transfer chamber and the process chamber is followed by a transfer chamber, buffer chamber and load lock chamber. The system also includes b) a conveyor device; c) a vacuum pump with an adapter flange in the region of the buffer chamber; d) at least two flow baffles in the buffer chamber; e) a system for the longitudinal and height displacement of (Continued)

the flow baffles; and f) an assembly for controlling the dynamic processes.

7 Claims, 4 Drawing Sheets

(56) References Cited

U.S. PATENT DOCUMENTS

| | | | |
|---|---|---|---|
| 6,302,372 B1 | 10/2001 | Sauer et al. | |
| 7,638,173 B2 | 12/2009 | Richert et al. | |
| 8,136,549 B2 | 3/2012 | Gawer et al. | |
| 2002/0005038 A1* | 1/2002 | Boeck | B64D 33/08 |
| | | | 60/204 |
| 2002/0020496 A1 | 2/2002 | Sinohara et al. | |
| 2011/0097490 A1* | 4/2011 | Kerr | C23C 16/45551 |
| | | | 427/248.1 |
| 2014/0044880 A1* | 2/2014 | Koparal | C23C 14/568 |
| | | | 427/404 |
| 2015/0274420 A1* | 10/2015 | Krommer | B65G 47/918 |
| | | | 414/266 |

FOREIGN PATENT DOCUMENTS

| | | | | |
|---|---|---|---|---|
| DE | 3612721 A1 * | 10/1987 | | C23C 14/34 |
| DE | 19808163 | 7/1999 | | |
| DE | 10322935 | 12/2004 | | |
| DE | 102012202715 | 8/2013 | | |
| EP | 0340199 A2 * | 1/1989 | | C03B 33/02 |
| JP | 2007116059 | 5/2007 | | |
| WO | WO 2009/004048 * | 1/2009 | | C23C 14/56 |

* cited by examiner

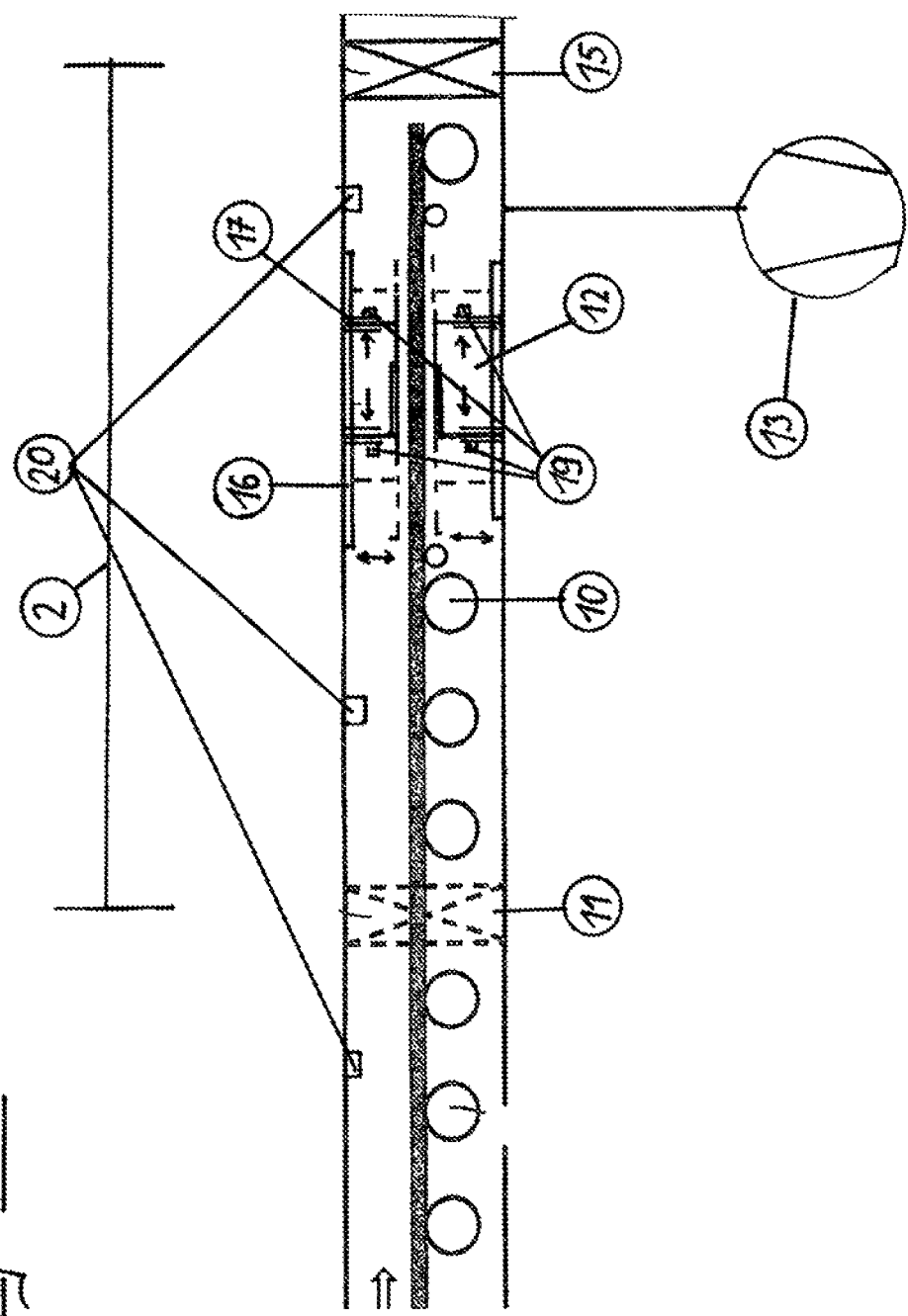

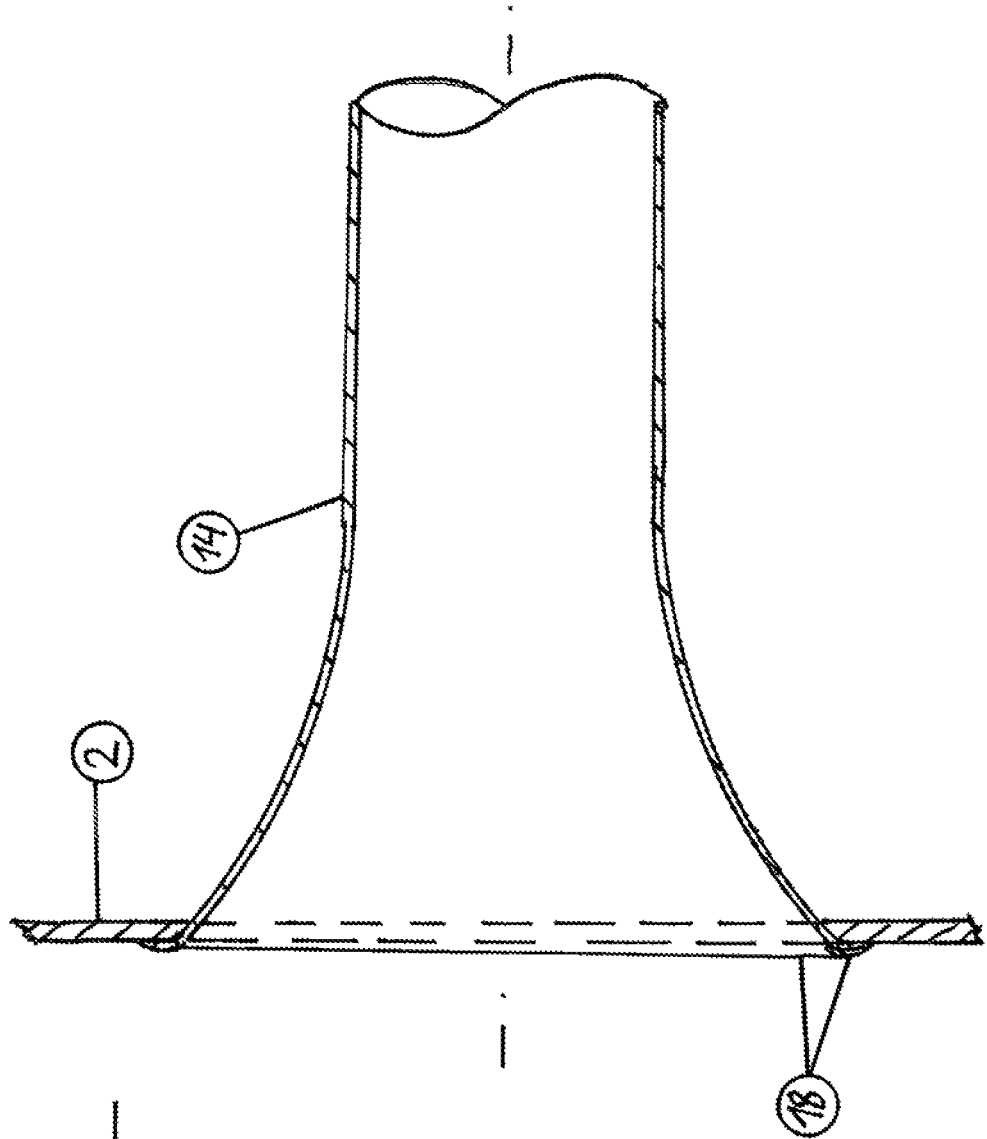

DEVICE FOR COATING EXTRA-LONG SHEET-TYPE SUBSTRATES, IN PARTICULAR GLASS PANES, IN A VACUUM COATING SYSTEM

CROSS-REFERENCE TO RELATED APPLICATIONS

This application is a § 371 national stage entry of International Application No. PCT/DE2016/000376, filed on Oct. 20, 2016, which claims priority to German Patent Application No. 10 2015 013 799.9, filed Oct. 26, 2015, the entire contents of which are incorporated herein by reference.

The invention relates to a device and to a method for coating extra-long planar substrates, in particular glass panes, in a vacuum coating system.

Magnetic field supported cathode atomizing (magnetron sputtering) has entered many sectors of modern surface technology. Proceeding from applications in semiconductor electronics, magnetic field supported cathode atomizing today is established as an industrial coating method for architectural glass, flat screens, optical glass, strip material, tools, decorative objects, and functional components.

The largest vacuum coating systems, and thus often also the systems requiring most energy, are the typical horizontal in-line systems for the coating of architectural glass.

In the course of the development, standard pane formats have been established both for coating as well as for further processing and logistics. The coating systems are typically conceived for the standard pane formats (for example, 6.00 m length×3.21 m width).

Extra-large pane formats are additionally coated in the coating systems. The proportion in percentage of these extra-large pane formats in terms of the entire production volume is rather minor, so that possibilities for also coating extra-long pane formats (for example, 12.00 m length×3.21 m width) without significant investments are achieved by means of technical and control-technological adaptations.

According to the prior art, specific assemblies of vacuum pumps, or of vacuum pumping units, respectively, and also flow baffles within vacuum chambers are used in order for a coating system to be utilized for both standard panes as well as for extra-long pane formats.

Reference is made to the following publications in the prior art:

A method for operating an in-line coating system is described in EP 1 571 234 B1.

In order for planar substrates, in particular glass panes, to be coated substrates are coated under vacuum conditions in the coating system, wherein material that is removed from the target is deposited on the respective substrate. The method introduced here is based on the object of being able to coat both normal substrates as well as extra-long substrates by way of only one coating system.

In the case of this method, the following prior art is referred to in the preamble of patent claim 1. Said prior art proceeds from a method for operating an in-line coating system having a load lock chamber, a buffer chamber adjoining the former, a process chamber adjoining the latter, a further buffer chamber adjoining said process chamber, and a discharge lock chamber adjoining the latter buffer chamber. In the case of this method, doors which can be opened and closed are provided between the chambers, wherein the load lock chamber, the buffer chamber, and the discharge lock chamber are predefined as modules of the same type and for receiving substrates up to a predefined maximum size.

In order for the objective mentioned to be achieved, it is claimed in the characterizing part of patent claim 1 that for coating substrates which are larger than the modules, the door between the load lock chamber and the buffer chamber, and the door between the buffer chamber and the discharge lock chamber, and the door between the buffer chamber and the discharge lock chamber can be opened, and the pressure conditions of the buffer chamber and of the load lock chamber and of the discharge lock chamber, respectively, can be adapted to one another.

WO 2009/004048 A1 relates to a method and to a device for moving extra-long substrates through locks in vacuum coating system. In the case of such methods, three-chamber vacuum coating systems or five-chamber coating systems are usually used. As opposed to the five-chamber coating system, the three-chamber coating system does not have any buffer chamber.

While no specific objective is stated in this publication, it can be derived from the description, in particular at the top of page 5, that besides the use of this method for coating extra-long substrates by means of decoupling pressure within a lock system stated in the title, the pumping times for the lock system and thus the cycle times of the system are reduced as compared to the operation as a three-chamber system.

A method for loading/discharging a substrate by way of locks to and from a vacuum coating system is claimed in patent claim 1 of WO 2009/004048 A1, wherein in this system a buffer chamber is adjacent to a lock chamber, and a process region is adjacent to said buffer chamber, the lock chamber and the buffer chamber to be separated from one another by in each case one closable intermediate door, and the lock chambers comprising a first pump system and the buffer chamber comprising a second pump system, said method comprising the following method steps:

a) transporting the substrate through an opened entry-side door that is closable in a vacuum-tight manner into a lengthened lock chamber formed from the lock chamber and the buffer chamber in the case of an opened intermediate door, wherein a door that at the exit side closes the lengthened lock chamber is closed in a vacuum-tight manner;

b) closing the entry-side door, and setting pressure conditions in the lengthened lock chamber so as to have a pressure differential between the lock chamber and the buffer chamber, there being a lower pressure in the buffer chamber, by using a flow resistance which is disposed in the lengthened lock chamber; and c) opening the exit-side door, and transporting the substrate out of the lengthened lock chamber.

In the vacuum coating system described in WO 2009/004048 A1 it is disadvantageous that a first pump system is required in the lock chamber, and a second pump system is required in the buffer chamber, each pump system being composed of many pumps. Typically, the entire volume formed from the lock chamber and of the buffer chamber herein is first evacuated by the pump system of the lock chamber to a pressure of p<20 mbar. The pump system of the buffer chamber then takes over, and further evacuates the volume to a pressure p<0.02 mbar.

It is the object of the present invention to achieve a cost-effective and reliable possibility for heavily reducing the number of pumps, wherein the productivity is maintained and the reliability and the safety of the system are enhanced.

This object is achieved by the device as claimed in claim 1, a device for coating extra-long planar substrates, in particular glass panes, in a vacuum coating system, said device having the following features:
  a) a sequence of chambers disposed on the entry side that are to be passed by the respective substrate plate (9), specifically a lock chamber (1), a buffer chamber (2), and a transfer chamber (3), wherein each of these chambers at the entry side is closable in an air-tight manner by means of a flap valve (8, 11, 15), and wherein the transfer chamber (3) is followed by a region of process chambers (4), and the process chambers (4) are followed by an exit-side sequence of a transfer chamber (5), a buffer chamber (7) and a lock chamber (8);
  b) a transport device (10) constructed on rollers;
  c) a single high-output vacuum pump (13) having an adapter flange (14) in the region of the buffer chamber (2);
  d) at least one flow baffle (12) in the region of the buffer chamber (2);
  e) an installation (16) for the longitudinal displacement of the flow baffles (12), and an installation (17) for the height adjustment of the flow baffles (12); and
  f) an assembly for controlling the movement procedures; it furthermore being claimed that sensors (19) for monitoring the installations (16) for the longitudinal displacement of the flow baffles (12), and/or the installation (17) for the height adjustment of the flow baffles (12) are provided; and it also being claimed that light field sensors (20) are provided for the control-technological management of the entire coating process;
or by the method as claimed in claim 4, respectively,
a method for coating extra-long planar substrates, in particular glass panes, in a vacuum coating system, comprising the following method steps:
  a) after opening an entry-side flap valve (8) of an entry-side lock chamber (1), the substrate plate (9) to be coated is transported by means of a transport device (10) into the lock chamber (1), wherein in the case of an extra-long substrate plate (9) the entry-side flap valve (11) of a buffer chamber (2) which follows the lock chamber (1) is simultaneously open, and wherein the entry-side flap valve (15) of a following transfer chamber (3) is closed;
  b) after the substrate plate (9) has passed the region of the flap valve (8) the flap valve (8) is closed;
  c) thereafter a longitudinal displacement and a height adjustment of the installed flow baffles (12) are performed by means of an installation (16) and an installation (17), so as to depend on the dimensions of the substrate plate (9) in terms of the length and thickness of the latter;
  d) after the operation of a high-output vacuum pump (13) the substrate plate (9) is transported into the region of the process chambers (4);
  e) after the coating process the substrate plate (9) by means of a transfer chamber (5), a buffer chamber (6), and a lock chamber (7) is conveyed to the exit of the vacuum coating system; it being furthermore claimed that sensors (19) are provided for monitoring the installations (16) for the longitudinal displacement of the flow baffles (12) and/or the installation (17) for the height adjustment of the flow baffles (12); that light field sensors (20) are provided for the control-technological management of the entire coating process; and a computer software program having a program code for carrying out the method steps when the software program is executed in a computer; and a machine-readable carrier having the program code of a computer software program for carrying out the method when the software program is executed in a computer also being claimed.

The device according to the invention will be explained in more detail hereunder. In the figures in detail:

FIG. 3 shows a cross-section from the region of the buffer chamber; and

FIG. 4 shows the design embodiment of an adapter flange.

Figure 1:
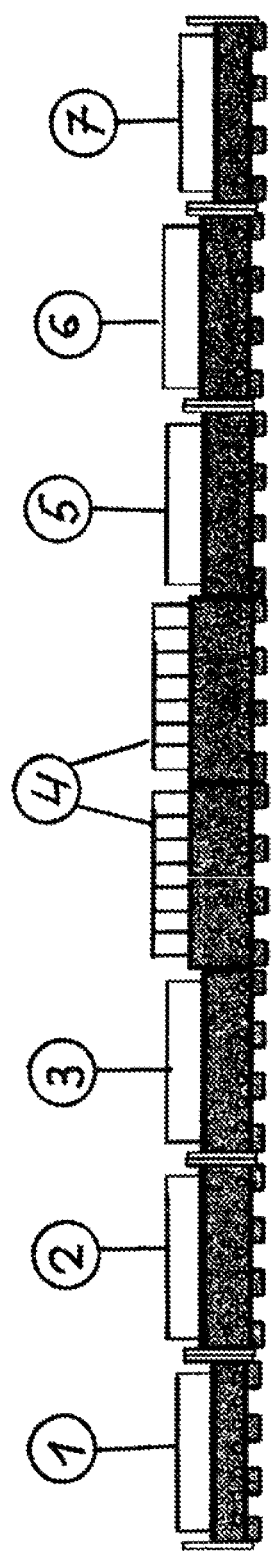
FIG. 1 shows a device according to the invention in the longitudinal section.

FIG. 1 shows a device according to the invention in the longitudinal section. The entire vacuum coating system in the processing direction is composed of an entry-side lock chamber 1 into which the substrate to be coated enters from the region of the normal atmosphere, a following buffer chamber 2, and a transfer chamber 3 which follows these two chambers. In the further course of the coating process the substrate makes its way into the region of the two process chambers 4 in which the actual process of coating takes place. Once the coating has been performed, the substrate is again guided, in a reversed sequence as in the region of the entry-side chambers 1, 2, 3, by way of the exit-side transfer chamber 5 into the exit-side buffer chamber 6, and then into the exit-side lock chamber 7. The coated substrate, when exiting the exit-side lock chamber 7, reaches the region of the normal atmosphere again.

Figure 2:
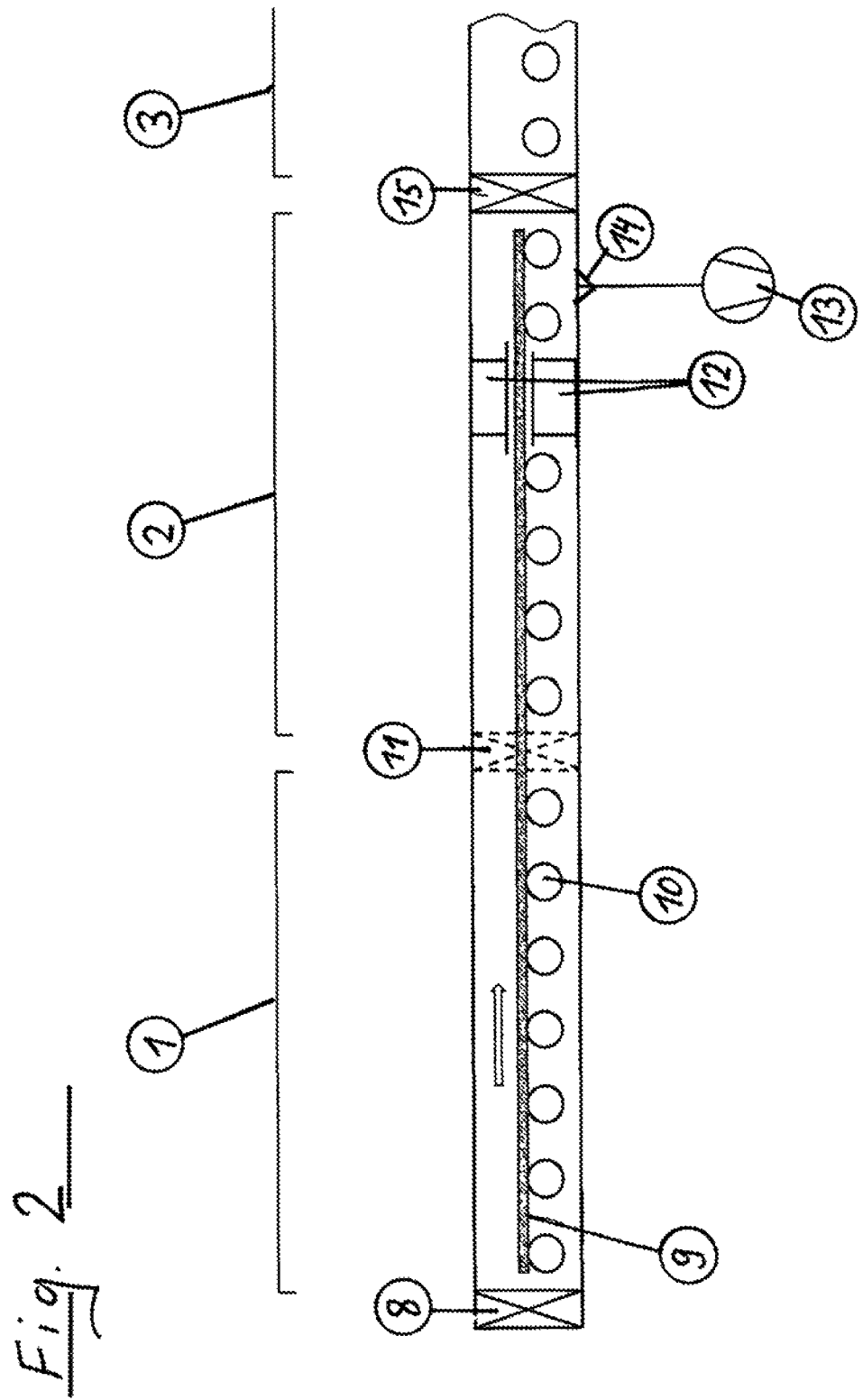
FIG. 2 shows a cross-section from the entry region of the vacuum coating system according to the invention.

FIG. 2 shows a cross-section from the entry region of the vacuum coating system according to the invention, wherein the regions of the lock chamber 1, the following buffer chamber 2, and part of the furthermore following transfer chamber 3 in the upper part of FIG. 2 are marked by means of correspondingly identified region limits.

Here, a substrate plate 9 can be seen in the cross-section on a transport device 10, wherein the transport device 10 is symbolically represented by means of idler rollers that are illustrated so as to be circular in the cross-section, the substrate plate 9 having left behind the region which closes the entry region of the vacuum coating system in a vacuum-tight manner in relation to the normal atmosphere. This entry region is formed by the normal atmosphere by means of the entry-side flap valve 8 of the lock chamber 1. The entire length of the substrate plate 9 in this example shown can be identified as extra long, as said substrate plate 9 in terms of the length thereof runs from the start of the lock chamber 1 across the entire length thereof up to almost the end of the adjacent buffer chamber 2. The direction of movement of the substrate plate 9 herein is identified by means of an arrow in the lock chamber 1. The flap valve 11 that is provided at the start of the buffer chamber 2 is illustrated by dashed lines in FIG. 2 and thus as opened, as the extra length of the substrate plate 9 requires said flap valve 11 to be opened.

Flow baffles 12 which run so as to be parallel with part regions of the two surfaces of the substrate plate are symbolically illustrated as two lines in the region of the buffer chamber 2, wherein the spacing of said flow baffles 12 from these two surfaces is capable of being set in a variable manner.

A flow baffle reduces the open cross-section around the substrate plate that is to be transported through the vacuum coating system in such a manner that a gas exchange in the adjacent chamber regions is impeded so as to depend on the pressure conditions, and an equalization of pressure is thus prevented. Depending on the position of one or a plurality of flow baffles, pressure differentials at different increments, having one or more pressure levels within a lock system, can be generated. Such a flow baffle has the effect that, in the case an extra-long substrate plate 9 being coated, a pressure differential is generated in the region of the lock chamber 1 and a buffer chamber 2 that are connected by an open flap valve 11, said pressure differential corresponding to the pressure conditions as prevail in the case of a closed flap valve 11.

Furthermore illustrated in the region of the buffer chamber 2 are an adapter flange 14 for the operation of a high-output vacuum pump 13, and the entry-side flap valve 15 of the transfer chamber.

FIG. 3 shows a cross-section from the region of the buffer chamber. In particular, the conditions around the flow baffles 12 are illustrated in more detail here. As has already been noted in the context of the description of FIG. 2, the spacings of the flow baffles 12 from the two surfaces of the substrate plate 9 to be coated are designed so as to be variable, this being effected by an installation 17 for the height adjustment of the flow baffles 12. This serves for adapting the flow baffles 12 to the thickness of the respective substrate plate 9, on the one hand. On the other hand, the spacing of the two flow baffles 12 from the two surfaces of the substrate plate 9 influences the pressure differential within the lock system that is caused by the arrangement of the flow baffles 12. The same purpose is also served by an installation 16 which increases or decreases the area of the flow baffle 12 in the horizontal direction, thus in a manner so as to be longitudinally displaceable in parallel with the surface of the respective substrate plate 9. A sheet metal face which is designed so as to be horizontally displaceable in a further sheet metal pocket that bears tightly on the former can serve as a mechanism for such an arrangement. Server motors (not identified in more detail) are provided as drives for the vertical and horizontal displaceability of one or a plurality of flow baffles 12. The control of these server motors is supported by sensors 19 for measuring the spacing and the longitudinal adjustment of the flow baffles 12. The constructive design embodiment of corresponding adjustment mechanisms for the adjustability of the flow baffles 12 described are known to a person skilled in the art. The light field sensors 20 which are illustrated in exemplary manner in FIG. 3 serve for the further control-technological management of the entire coating process.

In terms of these light field sensors 20 used, reference is made to the development of the so-called mini lenses which in the form of hundreds of mini lenses collect items of optical information according to the light field principle, said items of optical information then being able to be assembled by data technology to form images having a desired resolution and/or a desired viewing angle. Such mini lenses are 3D-capable, cheap to produce, and are based on the principle of the eye of an insect. Besides the normal pivotability, the desired viewing angle and/or the desired enlargement of an image detail can be obtained in a purely electronic manner with the aid of these light field sensors 30.

FIG. 4 shows the design embodiment of an adapter flange. The adapter flange 14 known from the description of FIG. 2 is fastened to the entry-side buffer chamber 2 by means of an annular connector 18, and has a cross-section which counters the high-output vacuum pump 13 with a low flow resistance, the shape of a hyperbolic cylinder being preferably considered here. Currently, dual-stage vacuum systems having preliminary pumps which operate counter to the atmospheric pressure, and downstream screw pumps or Roots pumps are used as high-output vacuum pumps 13, said high-output vacuum pumps 13 having an operating pressure range of 1013 mbar to 0.003 mbar and herein being able to deliver an intake volumetric flow of 2700 to 5700 $m^3/h$, in individual cases also an additional dynamic volumetric flow of up to 20,000 $m^3/h$.

The arrangement for controlling the movement procedures, in particular of the transport device (10), the activation of the flap valves, the adjustment of the flow baffles, and the activation of the high-output vacuum pump, is not separately identified.

The complex control of the movement sequences described requires a special control software program.

LIST OF REFERENCE SIGNS

1 Region of the entry-side lock chamber
2 Region of the entry-side buffer chamber
3 Region of the entry-side transfer chamber
4 Region of the process chambers
5 Region of the exit-side transfer chamber
6 Region of the exit-side buffer chamber
7 Region of the exit-side lock chamber
8 Entry-side flap valve of the lock chamber
9 Substrate plate (extra-sized dimension)
10 Transport device
11 Entry-side flap valve of the buffer chamber
12 Flow baffles
13 High-output vacuum pump
14 Adapter flange
15 Entry-side flap valve of the transfer chamber
16 Installation for the longitudinal displacement of the flow baffle
17 Installation for the height adjustment of the flow baffle
18 Annular connector for the adapter flange 14
19 Sensors for measuring the spacing
20 Light field sensors

The invention claimed is:

1. A device for coating planar substrate plates, in a vacuum coating system, said device having the following features:
    a) a sequence of chambers disposed on an entry side that are to be passed by the substrate plates (9), said sequence of chambers comprising an entry lock chamber (1), an entry buffer chamber (2), and an entry transfer chamber (3), wherein each of the sequence of chambers at the entry side is closable in an air-tight manner by means of a flap valve (8, 11, 15), and wherein the transfer chamber (3) is followed by a region of process chambers (4), and the process chambers (4) are followed by an exit-side sequence of an exit transfer chamber (5), an exit buffer chamber (7) and an exit lock chamber (8);
    b) a transport device (10) comprising rollers;
    c) a vacuum pump (13) having an adapter flange (14) in the region of the entry buffer chamber (2);
    d) at least one flow baffle (12) in the region of the buffer chamber (2);
    e) a first adjustment mechanism (16) for the longitudinal displacement of the at least one flow baffle (12), and a second adjustment mechanism (17) for the height adjustment of the at least one flow baffle (12); and
    f) a control assembly for controlling the coating device.

2. The device as claimed in claim 1, characterized in that sensors (19) for monitoring the first installations (16) for the longitudinal displacement of the at least one flow baffles (12), and/or the second installation (17) for the height adjustment of the at least one flow baffles (12) are provided.

3. The device as claimed in claim 1, characterized in that light field sensors (20) are provided for the control-technological management of the entire coating process.

4. The device as claimed in claim 1, wherein said transport device is adapted for transporting the substrate plates, sequentially, through the entry lock chamber (1), the entry buffer chamber (2), the entry transfer chamber, the process chambers, the exit transfer chamber, the exit buffer chamber, and the exit lock chamber.

5. The device as claimed in claim 1, wherein said transport device is adapted for transporting the substrate plates horizontally.

6. The device as claimed in claim 1, wherein the at least one flow baffle comprises at least two flow baffles.

7. The device as claimed in claim 6, comprising at least one flow baffle adapted to be positioned above a planar substate plate supported by the transport device and at least one flow baffle adapted to be positioned below a planar substrate plate supported by the transport device.

\* \* \* \* \*